United States Patent [19]

Tada et al.

[11] Patent Number: 5,189,386
[45] Date of Patent: Feb. 23, 1993

[54] ALUMINUM-STABILIZED SUPERCONDUCTOR AND SUPERCONDUCTING COIL, AND METHOD OF MANUFACTURING THE SUPERCONDUCTOR

[75] Inventors: Naofumi Tada; Fumio Iida; Ryukichi Takahashi, all of Hitachi; Naoki Maki, Ibaraki; Shuji Sakai, Tsuchiura; Yoshiji Hotta, Hitachi, all of Japan

[73] Assignees: Hitachi, Ltd.; Hitachi Cable Ltd., both of Tokyo, Japan

[21] Appl. No.: 754,230

[22] Filed: Aug. 28, 1991

Related U.S. Application Data

[63] Continuation of Ser. No. 555,027, Jul. 20, 1990, abandoned.

[30] Foreign Application Priority Data

Jul. 21, 1989 [JP] Japan .................................. 1-187362
Sep. 30, 1989 [JP] Japan .................................. 1-255436

[51] Int. Cl.$^5$ .............................................. H01F 7/22
[52] U.S. Cl. .................................. 335/216; 174/125.1; 505/924; 505/879; 428/651
[58] Field of Search .................. 174/125.1; 505/813, 505/924, 879; 29/599; 335/216; 428/614, 674, 651, 930

[56] References Cited

U.S. PATENT DOCUMENTS

| | | | |
|---|---|---|---|
| 3,623,221 | 5/1967 | Morton et al. | 29/599 |
| 4,109,374 | 8/1978 | Whetstone et al. | 174/125.1 |
| 4,506,109 | 3/1985 | Onishi et al. | 29/599 |
| 4,652,697 | 3/1987 | Ando et al. | 29/599 |
| 4,723,355 | 2/1988 | Both et al. | 29/599 |
| 4,752,654 | 6/1988 | Iida et al. | 29/599 |
| 5,001,020 | 3/1991 | Ohmatsu et al. | 428/651 |

FOREIGN PATENT DOCUMENTS

| | | |
|---|---|---|
| 0230567 | 1/1986 | European Pat. Off. . |
| 3430159 | 3/1985 | Fed. Rep. of Germany ... 174/125.1 |
| 52-144790 | 12/1977 | Japan . |

OTHER PUBLICATIONS

IEEE Transactions on Magnetics, vol. 21, No. 2, Mar. 1985.

*Primary Examiner*—Gerald P. Tolin
*Assistant Examiner*—Trindad Korke
*Attorney, Agent, or Firm*—Antonelli, Terry Stout & Kraus

[57] ABSTRACT

Disclosed is a superconductor which has an aluminum area at the center of the cross section of the superconductor and a copper-covered multifilamentary NbTi composite conductor at the periphery parts of the cross section formed around the aluminum area, wherein the cross-sectional area ratio of (Cu+Al)/NbTi is in the range of 0.5 to 3.0 and the cross-sectional area ratio of Al/Cu is in the range of 0.05 to 0.5.. The superconductor is provided by a method comprising a first step of providing a superconductor-copper composite hollow body in which copper films are applied around the superconductors, a second step of area reducing the composite hollow body, a third step of heat treating the body, a fourth step of inserting an aluminum body into the hollow of the hollow body, a fifth step of subjecting the body to working such as drawing, a sixth step of subjecting the body to working such as twisting, forming or the like, with an additional area reduction being carried out, if necessary, subsequent to the third step. A superconducting coil is made using the superconductor, and the coil is used for a magnetically levitated vehicle or a nuclear magnetic resonance apparatus.

32 Claims, 5 Drawing Sheets

F I G. 1
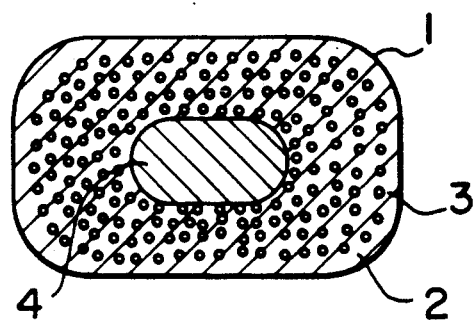
F I G. 2
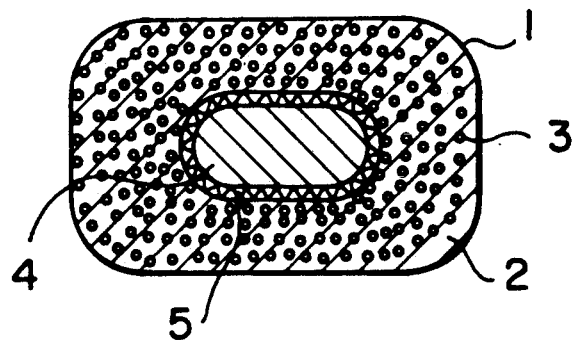

ALUMINUM-STABILIZED SUPERCONDUCTOR AND SUPERCONDUCTING COIL, AND METHOD OF MANUFACTURING THE SUPERCONDUCTOR

This application is a continuation of application Ser. No. 07/555,027, filed on Jul. 20, 1990 is now abandoned.

BACKGROUND OF THE INVENTION

Field of the Invention

The present invention relates to a light-weight aluminum-stabilized superconductor having a high current density and high stability, and a superconducting coil using the conductor, particularly for use in magnetically levitated vehicles, nuclear magnetic resonance apparatuses or the like, which have a light weight and a reliability, and a method of manufacturing the superconductor.

Description of Related Art

As a superconductor for a superconducting magnet is in general used a multifilamentary superconductor comprising a plurality of superconducting filaments embedded in a stabilizing matrix of high purity copper. On the other hand, there has recently been developed a method of manufacturing an aluminum-stabilized superconductor using high purity aluminum as the stabilizing matrix to impart a high current density and a high stability margin to the coil. This conductor effectively utilizes the excellent properties of high purity aluminum that the high purity aluminum has a lower resistivity than that of high purity copper at cryogenic temperatures, a magnetic resistance effect saturated at a high magnetic field, a higher thermal conductivity (about 6.4 times higher than that of copper) and a lower specific gravity.

However, a high performance aluminum-stabilized multifilamentary NbTi superconductor has not been able to be made, since high purity aluminum is too soft and a difference in deformation resistance between the aluminum and the superconducting material such as NbTi is large. In addition, since aluminum is much lower in tensile strength than copper, it cannot fully be subjected to tension when formed in coil. Furthermore, a superconducting coil containing aluminum has poor electromagnetic resistance.

Under the circumstances, some methods of manufacturing a superconductor using a composite of copper and aluminum as stabilizing matrix have been proposed. These methods are roughly classified in a method in which the periphery of the superconductor is covered with aluminum in the cross-sectional view of the superconductor, a method in which aluminum is present at the center of the superconductor in the cross-sectional view of the superconductor, and a method in which aluminum is present both at the periphery and the center of the superconductor in the cross-sectional view of the superconductor. The superconductor at the center of which aluminum is present is preferred in view of winding, magnet deformation and a.c. loss reduced under varying magnetic field.

Hitherto, when a superconductor at the cross-sectional center of which aluminum is placed is to be obtained, a high purity copper-made thick-wall tube with a center hollow is perforated in a longitudinal direction, NbTi filaments are inserted into the perforations, a high purity aluminum rod is inserted into the center hollow, and the tube is drawn by a usual process known to copper matrix superconductors, i.e., drawing, heat treatment and forming [see Japanese Patent KOKAI (Laid-Open) No. 49-107479].

On the other hand, in order to prevent aluminum from being made impure by the reaction of copper and aluminum in heat treatment, at least one of the central aluminum rod and the peripheral high purity copper is provided with an oxide film at the interface between the aluminum and copper [see Japanese Patent KOKAI (Laid-Open) No. 51-99995]. Alternatively, a metal such as niobium, tantalum or vanadium is provided between copper and aluminum [see Japanese Patent KOKAI (Laid-Open) No. 52-144790]. Thus, various methods of producing the aluminum-stabilized superconductor are already known.

However, the conventional methods including the first steps of assembling the copper tube, NbTi filaments and aluminum rod as mentioned above and the last steps of area reduction, heat treating, twisting the forming as generally used for copper material conductors, employ a high area reduction until the last step. Thus, these methods have such a problem that they do not pay any attention to a large difference in plastic working between NbTi and aluminum.

As mentioned above, there is known such a way that a reaction-preventing material such as niobium and tantalum is disposed between aluminum and copper to prevent the contamination of aluminum due to the diffusion reaction therebetween during the heat treatment. In this case, the kind of the materials used and the number of process steps are increased and hence the costs are undesirably increased.

The known methods of manufacturing an aluminum-stabilized superconductor as mentioned above require the heat treatment at 350° to 400° C. for a long period of time for improving the critical current density of NbTi during the intermediate step of making fine filaments. In this step, thermal diffusion occurs at the interface between aluminum and copper to render high purity aluminum impure. Therefore, these methods are required to have a particular step of providing a reaction-preventing oxide film or a reaction-preventing layer of niobium, tantalum or vanadium between copper and aluminum. Thus, the conventional methods have many problems that the number of process steps are increased and the process is complicated.

As for the superconductor for use in magnetically levitated vehicles Journal of the Japan Machinery Society Vol. 91, No. 835, published June 1988, pp. 36-40 discloses a multifilamentary NbTi superconductor having a low copper ratio (a Cu/NbTi cross-sectional area ratio), which is, for example, 1.0 for the superconductor which has recently been used for MLU002 (one of JR test vehicles), in order to obtain a high current density coil.

A superconducting coil for magnetically levitated vehicles is a superconductor wound in a coil form and fixed with a binder such as an epoxy resin. The coil is set in a liquid helium container. The coil is required to be light in weight, since it is mounted on the vehicles. In addition, the floating force generated by magnetic induction is required to be increased by decreasing a distance between the centers of the superconducting coil on the vehicle and the coil on the ground.

Of the prior art coils, a multifilamentary NbTi superconductor having a low copper ratio, particularly a copper ratio of 1.0, wound in a coil form is poor in electromagnetic stability. Such coil has a problem that the superconducting coil on the vehicle is often quenched due to disturbance energy generated when the magnetically levitated vehicle is running at a high speed.

Furthermore, no attention has been paid to a high current density coil with prior art superconductors substituting aluminum for the entirety or part of copper [Japanese Patent KOKAI (Laid-Open) Nos. 47-25560, 50-36159 and 52-138443]. In fact, there are present only superconductors having a high (Cu+Al)/NbTi cross-sectional area ratio and a high Al/Cu cross-sectional area ratio. Such conductors have a low current density, and the coils of such conductors give a low floating force to the magnetically levitated vehicles.

Superconductors having a high Al/Cu cross-sectional area ratio easily form interstices between conductor and conductor when made in a coil winding, since aluminum is soft and weak in strength. Furthermore, the coils made from such conductors are easily deformed by electromagnetic force when magnetically excited, so that the mechanical stability of the coils becomes poor.

Similarly, there are such problems in the superconducting coil for use in nuclear magnetic resonance apparatuses.

SUMMARY OF THE INVENTION

One object of the present invention is to provide a method of manufacturing an aluminum-stabilized superconductor which is highly stable and inexpensive, with a low area reduction of an aluminum-inserted tube and without using any special material for preventing the diffusion reaction between copper and aluminum.

Another object of the present invention is to provide a method of manufacturing an aluminum-stabilized superconductor which has a small amount of heat generated when exposed to varying magnetic field.

Further object of the present invention is to provide a superconducting coil for use in magnetically levitated vehicles, which is difficult to be quenched when the vehicles are running at a high speed, that is, is highly reliable.

Still further object of the present invention is to provide a superconducting coil for use in magnetically levitated vehicles, which has a high floating force even at a low magnetomotive force, that is, is light in weight.

The other objects of the present invention are to provide a superconducting coil for use in a nuclear magnetic resonance apparatus which is light-weight, small-sized and highly reliable, and to provide a superconductor and superconducting coil which has both thermal and mechanical stability and is hardly quenched since it has a low a.c. loss even under varying magnetic field.

BRIEF DESCRIPTION OF THE DRAWINGS

FIGS. 1, 2 and 3 are the cross-sectional structures of the superconductors according to the present invention.

DETAILED DESCRIPTION OF PREFERRED EMBODIMENTS OF THE INVENTION

According to the present invention, there is provided a method of manufacturing an aluminum-stabilized superconductor which comprises the first step of preparing a composite hollow body comprising a superconductor and copper in which the superconductor is covered with copper at the periphery thereof, the second step of area reducing the composite hollow body, the third step of heat treating the body, the fourth step of inserting aluminum into the hollow body, the fifth step of subjecting the body to working such as drawing, and the sixth step of subjecting the body to working such as twisting or forming, an additional step of area reducing the body being carried out subsequent to the third step.

In the method above, the area reduction subsequent to the third step is in the range of 50% to 90% and the area reduction subsequent to the fourth step is in the range of 50% or more.

Furthermore, the aluminum inserted in the fourth step is divided by materials having a higher resistivity than that of aluminum in a plurality of parts, which is preferred to achieve the objects of the present invention.

In accordance with the present invention, both aluminum and copper are used as a composite stabilizing matrix to prepare an aluminum-stabilized superconductor having an aluminum area at the center of the cross section of the superconductor. In order to produce the superconductor, a composite hollow body comprising copper and a superconducting material such as NbTi is firstly prepared and then heat treated. Into the hollow of this composite hollow body is inserted aluminum. Then, the aluminum-inserted body is subjected to area reduction, twisting and forming. These steps make it possible to cause thermal diffusion between the copper and aluminum not to occur and to produce the highly stable aluminum-stabilized superconductor exhibiting good workability without using any reaction-preventing materials.

Figure 4:
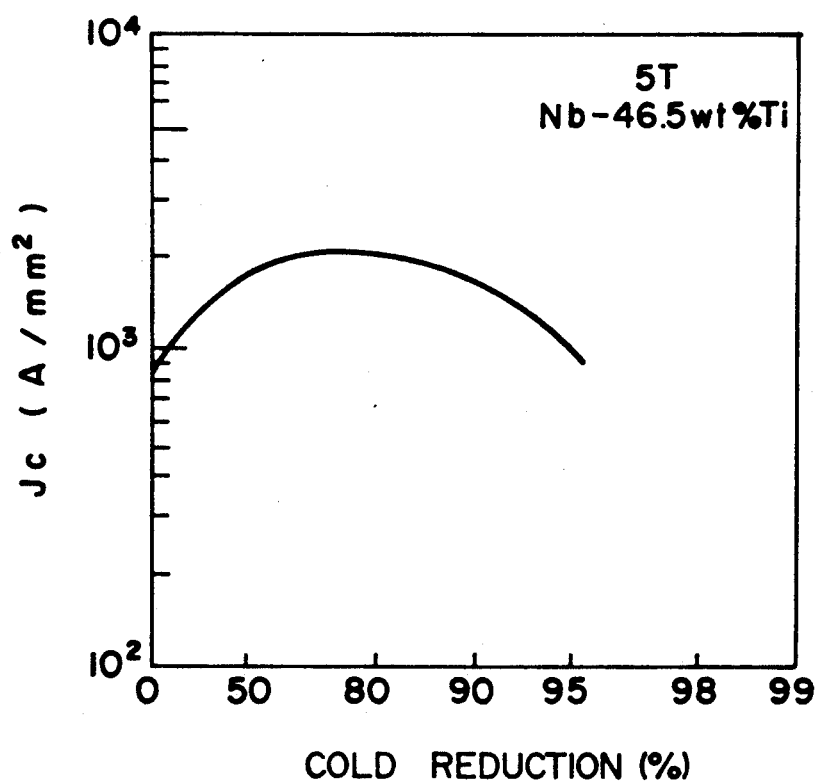
FIG. 4 shows a relationship between the cold reduction and critical current density of NbTi.

The critical current density of the multifilamentary NbTi superconductor varies depending upon an Nb/Ti amount ratio, heat treating conditions and number of the heat treatments. However, the critical current density varies principally depending upon the ratio of area reduction of the heat treated body. According to the present inventors' study, it has been found that the critical current density (Jc) is lowered at a ratio of area reduction below 50% and above 90%, as shown in FIG. 4. Therefore, the ratio of area reduction should preferably be in the range of 50 to 90% in the present invention.

The critical current density of the NbTi superconductor may vary depending upon a Ti content, conditions for precipitation heat treatment and cold reduction. Furthermore, the critical current density is a function of operating temperature and magnetic field. The lower the critical current density the higher the temperature and the higher the magnetic field.

The coils for magnetically levitated vehicles and nuclear magnetic resonance apparatuses require magnetic fields of about 5 T and about 2 T, respectively. The coils have different critical current densities in spite of the coils all using NbTi. Generally, a conductor having a high critical current density at a magnetic field in the vicinity of 5 T has a high critical current density even at a low magnetic field of 1 to 2 T. Therefore, the methods of manufacturing the NbTi superconductor are not required to be different between the superconductors for magnetically levitated vehicles and for nuclear magnetic resonance apparatuses.

The lower limit of the ratio of area reduction of the aluminum-inserted body is decided based on the necessity to secure the adhesion, i.e., electric contact between copper and aluminum. In view of differences in ratio of area reduction and deformation resistance between aluminum and copper, and the necessity to break the aluminum oxide film having high electric resistance, the ratio of area reduction of the aluminum-inserted body is preferably at least 50%.

The method of the present invention can provide a highly stable aluminum-stabilized multifilamentary superconductor exhibiting good workability and causing thermal diffusion between aluminum and copper not to occur without using any special reaction-preventing separator, by firstly preparing a composite hollow body of copper and a copper film-covered superconductor, subjecting the body to area reduction and heat treatment and then inserting aluminum into the hollow, then subjecting the aluminum-inserted body to area reduction, twisting and forming.

Furthermore, the method of the present invention can provide a superconductor having a reduced amount of a.c. loss generated under varying magnetic field without lowering the thermal stability, by finely dividing the cross-sectional aluminum area with a metal having a high electrical resistance, such as a CuNi alloy.

In accordance with the present invention, there is provided a superconductor which has an aluminum area at the center of the cross section of the conductor and a copper-covered multifilamentary NbTi composite conductor area at the periphery of the cross section of the conductor, wherein a (Cu+Al)/NbTi cross-sectional ratio is in the range of 0.5 to 3.0 and an Al/Cu cross-sectional ratio is in the range of 0.05 to 0.5.

The aluminum at the center of the cross section of the superconductor desirably has a residual resistance ratio $(R_{293K})/(R_{4.2K})$ in the range of 200 or higher.

The superconducting coil of the present invention is formed by winding the superconductor which has an aluminum area at the center of the cross section of the superconductor and a copper-covered multifilamentary NbTi composite conductor area at the periphery of the cross section of the conductor, wherein a (Cu+Al)/NbTi cross-sectional ratio is in the range of 0.5 to 3.0 and an Al/Cu cross-sectional ratio is in the range of 0.05 to 0.5.

Preferably, the superconducting coil of the present invention has a (Cu+Al)/NbTi cross-sectional ratio of 0.8 to 2.8 and an Al/Cu cross-sectional ratio of 0.1 to 0.4.

The superconducting coil of the present invention is formed by winding the superconductor which has an aluminum area at the center of the cross section of the superconductor and a copper-covered multifilamentary NbTi composite conductor area at the periphery of the cross section of the conductor and filling the interstices between conductor and conductor with a binder such as an epoxy resin, wherein the (Cu+Al)/NbTi and Al/Cu cross-sectional ratios are the same as mentioned above. The presence of this binder between conductor and conductor allow the conductor to be fixed and hardly electromagnetically and mechanically moved.

The "multifilamentary superconductor" used herein means a conductor comprising a great number of very thin superconducting filaments disposed at the periphery of the conductor surrounding the central area of aluminum in the cross section of the conductor, and the concept of the multifilamentary superconductor is derived from the essential stabilization theory for superconductors, briefly from the following empirical equation:

$$Jc \cdot d \leq 1,500$$

wherein Jc is the critical current density of the superconducting filaments in $A/cm^2$ and d is the diameter of the filaments in centimeter. In the case of a superconductor of NbTi, d is equal to 50 $\mu$m or less, when Jc $= 3 \times 10^5$ $A/cm^2$. According to the essential stabilization theory, no "flux jump" occurs with change of magnetic field and current and the superconducting coil containing such filaments electromagnetically stably works, if the diameter of the superconducting filament is below 50 $\mu$m. This has been experimentally confirmed. Thus, the diameter of the filaments used in the present invention is within the range known in the art.

On the other hand, the critical current of a superconductor is in proportion to the total cross-sectional area of superconducting filaments. Therefore, the number of the filaments of a multifilamentary superconductor is not always same. At present, a superconductor containing about 1,750 filaments of 28 $\mu$m thick embedded in copper matrix is used for magnetically levitated vehicles and a wire containing about 40 filaments of 50 $\mu$m thick embedded in copper matrix for MRI.

High purity aluminum present at the center of the cross section of a superconductor extends in the longitudinal direction of the conductor and has approximately the same shape at all the cross sections of the conductor. However, it is noted that the high purity aluminum is not always required to have the same cross-sectional shape as that of the conductor.

Since a stabilizing material such as aluminum and copper has a low resistance, eddy current flows through the stabilizing material when a magnetic field or current is being changed. The eddy current produces a heat and causes an a.c. loss. The eddy current loss is generally known to grow in proportion to the square of the width and length of the conductor. Therefore, the eddy current loss can be reduced to a considerable extent by dividing the stabilizing material in some parts with a metal having a higher resistivity than that of the stabilizing material.

The dividing is normally made in a direction of varying magnetic field. However, the stabilizing aluminum material is divided into a plurality of parts at the cross section of the conductor and extends in a continuous manner in the longitudinal direction of the conductor. The dividing way and the number of divided parts are not specific.

Furthermore, the stabilizing material such as aluminum and copper is utilized as having a small resistivity and a large thermal conductivity. The resistivity and thermal conductivity at a cryogenic temperature is known to vary to a large extent depending upon the purity of metal. In many cases, the purity of metal is not expressed with percentages but with a ratio of resistances at room temperature and a cryogenic temperature, i.e., a residual resistance ratio.

The stabilizing copper usually used has a residual resistance ratio of about 200 which is about 99.9% in purity. However, the residual resistance ratio should be at least about 100, which is 99.5% or more in purity for copper. Aluminum having a residual resistance ratio of about 100 has a purity of about 99.9%. The "high purity aluminum" usually used as stabilizing material has a purity of 99.999% which corresponds to a residual resistance ratio of at least 1,000.

The superconducting properties (critical temperature, critical current density and critical magnetic field) of an NbTi alloy are known to vary depending upon the Ti concentration, kind of metals added as third element, concentration of the element, cold reduction, precipitation heat treatments. The composition of the NbTi alloy now used is almost Nb-46.5 wt % Ti which has the highest critical magnetic field at present. A Nb-50 wt % Ti having a slightly higher Ti content may also be used. These NbTi alloys usually contain up to 0.3 wt % of incidental impurities. Of the impurities Ta is contained in the largest amount, i.e., about 0.1 wt %. On the other hand, an NbTi-ternary alloy containing a third element positively added therein to improve the superconductivity is known. As the third element, are known Ta, Zr, Hf and the like. The added amount ranges from a few percentages up to about 10%. This alloy is recently used in a high magnetic field at a superfluid temperature (in general 1.8K). These NbTi alloys all are applicable to the present invention, because there are no essential differences in superconducting properties and workability between these alloys.

As the binder used in the present invention reference is made to an epoxy resin, phenol resin, unsaturated polyester resin, urethane resin, melamine resin, urea resin, addition reaction-type polyester resin and silicone resin. Preferably the epoxy resin is used.

In order to utilize the advantage of aluminum to its maximum and improve the thermal stability in the superconductor according to the present invention, a reaction-preventing layer may be provided, if necessary, at the interface between the aluminum and the copper of the copper-covered multifilamentary superconductor area formed at the periphery of the superconductor.

The reaction-preventing layer can prevent the aluminum from being reacted with the copper to form a layer of compounds acting as a heat resistor. The reaction-preventing layer is normally and preferably made of nickel or niobium.

When the superconductor according to the present invention is used for a superconducting coil, the stabilizing material of aluminum present at the center of the cross section of the conductor is divided into a plurality of parts with a metal having a higher resistivity than that of aluminum and copper, in order to prevent quenching due to an a.c. loss generated under varying magnetic field. The metal is desirably CuNi.

The superconducting coil according to the present invention has a thermal stability improved and an amount of quenching generated due to the a.c. loss reduced by dividing the aluminum cross-sectional area into a plurality of parts.

The superconducting coil for use in a magnetically levitated vehicle according to the present invention comprises a superconductor having an aluminum area at the center of the cross section of the conductor therein and a copper-covered multifilamentary NbTi composite conductor at the peripheral part of the cross section formed there around, wound in a coil form, wherein the cross-sectional area ratio of (Cu+Al)/NbTi is in the range of 0.8 to 1.5 and the cross-sectional area ratio of Al/Cu is in the range of 0.1 to 0.4 and the coil has a binder between the conductor and conductor.

The superconductor of the present invention is preferably wound in a racetrack form in the coil. As the binder is preferably used an epoxy resin.

The superconducting coil for use in the magnetically levitated vehicle is required to be intimately wound.

Furthermore, a superconducting coil can have a higher reliability by using a reaction-preventing layer and/or dividing the aluminum area into a plurality of parts.

The superconducting coil for use in a nuclear magnetic resonance apparatus according to the present invention comprises a superconductor having an aluminum area at the center of the cross section of the superconductor therein and a copper-covered multifilamentary NbTi composite conductor area at the peripheral part of the cross section of the conductor formed there around, wound in a coil form, wherein the cross-sectional area ratio of (Cu+Al)/NbTi is in the range of 1.0 to 2.8 and the cross-sectional area ratio of Al/Cu is in the range of 0.1 to 0.4. This coil is desirably wound in a cylindrical form.

The superconducting coil for use in the nuclear magnetic resonance apparatus can also have a higher reliability of using a reaction-preventing layer and/or dividing the aluminum area into a plurality of parts.

Aluminum is well known to have better properties than copper at the cryogenic temperature at which the superconducting coil is operated. For example, aluminum of 99.999% in purity having a residual resistance ratio ($R_{293K}/R_{4.2K}$) of about 1,000 has a 0.91 time greater heat capacity, 6.4 times greater thermal conductivity and 0.14 time greater specific electric resistance at a magnetic field of 5T than those of oxygen-free copper, respectively. From these values it is considered that the stability margin of the superconductor is about 40 times greater than a conventional superconductor using a copper matrix, if there are no differences in the cross-sectional area, shape, dimension and operating point of the coil between both the coils.

Thus, aluminum is a thermally better stabilizing material than copper, but the former is too soft in a mechanical point of view. That is, aluminum has the problems at the point of strength, as mentioned below. Therefore, the aluminum cannot be used in a superconducting coil for magnetically levitated vehicles or nuclear magnetic resonance apparatuses. Firstly, since there is a great difference in deformation resistance between aluminum and NbTi, Conventional techniques cannot plastically work a high performance aluminum-matrix multifilamentary NbTi composite conductor. Secondly, since the aluminum-matrix wire cannot be wound with a high tension, interstices are produced between the wound conductor, so that the coil may be moved with electromagnetic force and deformed when magnetized. Therefore, the aluminum-matrix superconducting coil is not applicable to the magnetically levitated vehicles and the nuclear magnetic resonance apparatuses, particularly to the magnetically levitated vehicles required to run at a high speed.

Now it has been found that a superconductor using both aluminum and copper as matrix and containing the aluminum disposed at the center of the superconductor is preferred from the standpoint of the plastic working for drawing the superconductor and deformation of coil and ideally applied to the coils for the magnetically levitated vehicles and nuclear magnetic resonance apparatuses.

Since the superconducting coil for the magnetically levitated vehicles must have so high a current density as to give a floating force, the cross-sectional area of (Cu+Al)/NbTi is required to be rendered small. It is experimentally found that a superconducting coil comprising a copper-matrix conductor wound has no stability at various points with a Cu/NbTi cross-sectional area ratio of 5 or less. Therefore, the (Cu+Al)/NbTi cross-sectional area ratio of 5 or less is meaningless for a superconducting coil using a conductor containing aluminum disposed therein.

Taking the current density of coil into account, the (Cu+Al)/NbTi cross-sectional area ratio is desirably 3.0 or less for the coil for use in magnetically levitated vehicles, more particularly 1.5 or less.

If the (Cu+Al)/NbTi cross-sectional area ratio is too low, the total area of (Cu+Al) is so low that the coil becomes thermally unstable. The lower limit of (CuAl)/NbTi varies depending upon the Al/Cu cross-sectional area ratio but the limit should preferably be 0.5, more preferably 0.8 in the case of a relatively large amount of aluminum.

The coils for nuclear magnetic resonance apparatuses are required to have a high current density. Therefore, the (Cu+Al)/NbTi cross-sectional area ratio is required to be low for the conductor containing aluminum therein. This cross-sectional area of 5 or more is meaningless for the same reasons as mentioned for the magnetically levitated vehicles. Taking the current density of coil into account, the (Cu+Al)/NbTi cross-sectional area ratio should preferably 3.0 or less, more particularly 2.8 or less for nuclear magnetic resonance apparatuses.

In the case of the coils for nuclear magnetic resonance apparatuses as well as in the case of the coils for magnetically levitated vehicles, the total cross-sectional area of (Cu+Al) is so low that the coils become thermally highly unstable, if the (Cu+Al)/NbTi cross-sectional area ratio is too low. This lower limit also varies depending upon the Al/Cu cross-sectional area ratio but it should preferably be 0.5, more preferably 1.0.

The upper limit of the Al/Cu cross-sectional area ratio is decided from the standpoint of strength within the range of the (Cu+Al)/NbTi cross-sectional area ratio. Furthermore, if the Al/Cu cross-sectional area ratio is rendered higher, a conductor containing aluminum disposed at the center of the cross section of the superconductor is hardly plastically worked by drawing.

In accordance with the present invention, there is provided a (Cu+Al) matrix conductor which can be worked in the dimension and shape required by the magnetically levitated vehicles or nuclear magnetic resonance apparatuses and have an improved thermal stability without damaging the mechanical stability of the superconductor, wherein the (Cu+Al)/NbTi cross-sectional area ratio is in the range of 0.5 to 3.0 and the Al/Cu cross-sectional area ratio is in the range of 0.05 to 0.5.

A layer for preventing the reaction at the interface between aluminum and copper may be required by the superconductor containing aluminum disposed at the center of the cross section of the superconductor in a certain method of manufacturing the superconductor. For example, in the case where the conductor of the present invention is produced by a method of drawing a composite, a plurality of copper-covered NbTi monocore filaments are inserted into a copper tube with aluminum disposed at the center of the cross section of the conductor and then worked by drawing. The conductor is heat treated at a temperature of 350° to 400° C. for a long period of time during the drawing step, in order to increase the critical current density of the NbTi. The heat treatment has such a drawback that the copper and aluminum are reacted to form a intermetallic compound having a poor thermal conductivity. Therefore, the reaction-preventing layer not to allow any intermetallic compounds to be formed at 350° to 400° C. is provided between copper and aluminum, thereby obtaining more effectively the advantages of the present invention. The layer is actually made of, for example, Nb, Ni, Ti, Zr, V, Ta or CuNi.

Furthermore, a superconductor for magnetically levitated vehicles or a superconductor for nuclear magnetic resonance apparatuses having a thermal stability and a less amount of a.c. loss can be provided by dividing the aluminum contained in the superconductor with a metal layer having a higher resistivity than that of aluminum and copper.

Particularly, the superconducting coil for magnetically levitated vehicles is normally operated under a permanent current mode with d.c. magnetization. The coil on the vehicle undergoes periodic change of magnetic field from coils on the ground during running. Therefore, the alternate current component is superimposed on the direct current component of the superconducting coil, thereby generating an a.c. loss. Therefore, the superconducting coil comprising the superconductor of the present invention would therein has a less amount of a.c. loss even during the high-speed running and is hardly quenched.

The present invention will be illustrated below with reference some examples.

EXAMPLE 1

3280 composites (2.35 mm in diameter and 1 meter in length) comprising an Nb-46.5 wt % Ti alloy (2 mm in diameter; hereinafter referred simply to as NbTi) and copper were prepared by a known process.

Two oxygen-free copper tubes: one of 160 mm in outer diameter, 5 mm in wall thickness and 1 meter in length and the other of 75 mm in outer diameter, 5 mm in wall thickness and 1 meter in length were concentrically arranged, and the composites were washed by a known method and inserted between the two oxygen-free copper tubes.

Then, a hollow composite body of 50 mm in outer diameter comprising copper and NbTi was prepared by hydrostatic extrusion press, and drawn in a copper-covered multifilamentary composite hollow conductor of 6.36 mm in outer diameter and 5 mm in inner diameter.

After the hollow conductor was heat treated at 375° C. for 100 hours, a high purity aluminum wire having a purity of 99.999% was inserted into the multifilamentary composite hollow conductor, drawn at room temperature and twisted at a pitch of 25 mm to integrate the copper-covered multifilamentary NbTi conductor and the aluminum. This conductor was passed through a flat-type die to form a copper-covered multifilamentary NbTi composite superconductor of 1.9 mm × 1.1 mm in size having aluminum disposed at the center thereof and having a flat rectangular shape as shown in FIG. 1. The diameter of the NbTi filaments was 20 μm.

The critical current of the superconductor was determined to be 1,960 A in a magnetic field of 5 T in liquid helium.

No intermetallic compounds due to thermal diffusion were found by EPMA at the interface between copper and aluminum of the conductor. In addition, the adhesion between the copper and aluminum was very good.

In this example, the high purity aluminum may be inserted into the NbTi-Cu multifilamentary composite conductor which has been subjected to the heat treatment and the area reduction.

EXAMPLE 2

Figure 3:
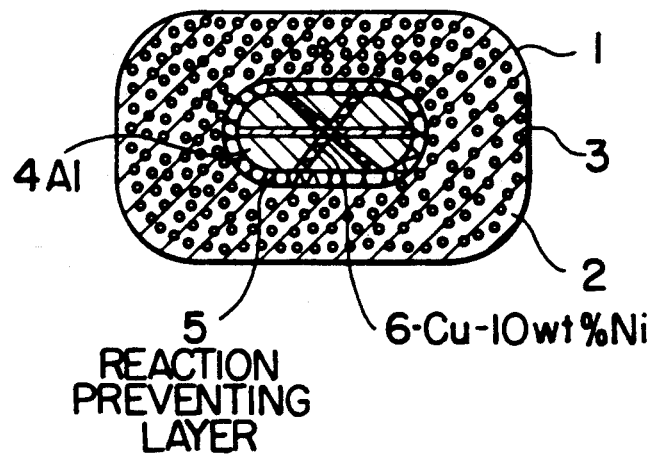

FIG. 3 is a cross-sectional view of the final product composite conductor containing high purity aluminum 4 having the same purity as in Example 1 divided into six parts with a Cu-10 wt % Ni layers 6 of about 10 μm thick and the reaction-preventing layer 5.

Thus, in this example, the high purity aluminum divided into six parts at the cross section thereof with the Cu-10 wt % Ni layers 5 and 6 was substituted for the high purity aluminum used in Example 1.

The critical current of this conductor was 1,920 A at a magnetic field of 5 T. The a.c. loss was determined by the boil-off method in a varying magnetic field at 50 Hz and B=0.2 T. The amount of the loss was about 80% of that of the superconductor in Example 1. This means that the advantages of the layers 5 were obtained.

EXAMPLE 3

A solenoid coil of 100 mm in inner diameter having a number of turns of 1,000 was made of the aluminum-stabilized superconductor as shown in Example 1.

The coil was prepared by subjecting the conductor to the insulation treatment on the surface thereof, winding the conductor at a tension of about 20 kg/mm$^2$ and impregnating the wound conductor with an epoxy resin. The cross section of the coil and the conditions for cooling the coil were equal to an actual coil for magnetically levitated vehicle.

This coil was cooled with liquid helium down to 4.2K and excited. Thus, it could be excited at a magnetic field of 5 T to 1,352 A. The average current density of the wound part of the coil was about 420 A/mm$^2$.

In this example, the superconductor has a flat rectangular cross-sectional shape but the present invention can produce a conductor having a round cross-sectional shape.

A multistrand conductor can be made by twisting a plurality of the superconductors according to the present invention, or a forced flow cooling type superconductor can also be made by inserting the conductor into a stainless steel-made conduit.

As mentioned above, the method of manufacturing the aluminum-stabilized conductor according to the present invention comprises the first step of preparing a composite hollow body comprising copper film-covered superconductor and copper, the second step of area reducing the composite hollow body, the third step of heat treating the body, the fourth step of inserting high purity aluminum into the central hole of the hollow body the fifth step of subjecting the body to drawing, and the sixth step of subjecting the body to twisting, forming of the like, an additional area reduction being carried out subsequent to the third step, if necessary. This method necessitates less steps and less amounts of materials than the conventional methods, since no thermal diffusion-preventing layers between copper and aluminum are needed by the conductor of the present invention. Good adhesion can be kept between copper and aluminum by the method of the present invention. Therefore, the aluminum-stabilized multifilamentary composite superconductor having a high stability and high performance can be provided with low costs.

EXAMPLE 4

Another superconductor as shown in FIG. 1 was produced by the method of the present invention.

The superconductor 1 had a flat rectangular cross-sectional shape of 1.9 mm × 1.1 mm, 3,280 Nb-46.5 wt % Ti (hereinafter referred to as NbTi) filaments 3 of 20 μm in diameter were uniformly embedded into copper matrix 2 to form the peripheral part of the conductor. High purity aluminum 4 of 0.8 mm × 0.4 mm having a purity of 99.999% was inserted at the central part of the conductor.

This conductor was prepared by assembling 3,280 copper-covered NbTi monocore filaments, inserting the assembled filaments between two tubes having diameters different from each other, extruding the inserted tubes under hydrostatic press and drawing the tubes to form a hollow copper-matrix multifilamentary NbTi composite conductor, then subjecting the conductor to the heat treatment at 375° C. for 100 hours, inserting the aluminum into the hole of the hollow conductor, drawing the aluminum-inserted conductor at room temperature to adhere the copper and the aluminum, passing the conductor through a flat-type die.

The cross-sectional structure of the conductor had a (Cu+Al)/NbTi cross-sectional area ratio of 1.0, an Al/Cu cross-sectional area ratio of 0.25. The critical current was 1,960 A at 4.2K and 5 T.

This conductor was compared with a conventional conductor free of aluminum, having the same cross-sectional dimensions and having a copper ratio (Cu/NbTi) of 1.0. As a result, it was found that the conductor of this example was 92% of the weight per length, 45% of the electric resistance of the matrix at 4.2K and 5 T, 126% of the heat capacity at 4.2 K and 145% of the thermal conductivity in the transverse direction of the conductor at 4.2 K, of the conventional conductor.

When the superconducting coil is excited at a constant current below the critical current of the superconductor constituting the coil, heat may be generated by any disturbance, thereby allowing the coil to be quenched. The minimum heat energy necessary for quenching is in proportion to the heat capacity and thermal conductivity of the conductor and in inverse proportion to the electric resistance of the matrix, if the relationship between the critical current and operation point of the superconductor is same. From the foregoing, it is clear that the stability margin of the superconductor according to the present invention is four times greater than that of the conventional conductor.

EXAMPLE 5

FIG. 2 is a schematical cross-sectional view of another example of the superconductors according to the present invention. This superconductor 1 had a flat rectangular cross-sectional shape of 2.1 mm × 1.3 mm and contained 3,280 Nb-46.5 wt % Ti (hereinafter referred to as NbTi) filaments 3 of 20 μm in diameter in copper matrix 2 uniformly embedded at the peripheral part of the conductor. A member comprising aluminum 4 of 99.999% in purity having a size of 0.8 mm × 0.4 mm and a reaction-preventing Nb layer 5 having a thickness of about 50 μm around the aluminum was placed at the central part of the conductor. This conductor was made in the same manner as in Example 4.

The cross-sectional structure of the conductor had a cross-sectional area ratio of 1.5 and an Al/Cu cross-sectional area ratio of 0.16. The critical current was 2,000 A at 4.2K and 5 T. The microscopic observation of the cross section of the conductor showed that there were no intermetallic compounds at the interfaces between the aluminum and niobium and between the copper and niobium.

This conductor was compared with a conventional conductor not containing aluminum and having a copper ratio of 1.0. As a result of comparison, it was found that the conductor of this example was 130% of the weight per length, which means that the conductor is somewhat heavier than the conventional conductor, 37% of the electric resistance of the matrix at 4.2K and 5 T, 116% of the heat capacity at 4.2K and 160% of the thermal conductivity in the transverse direction of the conductor at 4.2K, of the conventional conductor. From the foregoing, it is clear that the stability margin of the superconductor wire according to the present invention is four times greater than that of the conventional conductor.

EXAMPLE 6

FIG. 3 is a schematical cross-sectional view of a further example of the conductors according to the present invention. This superconductor 1 had a flat rectangular cross-sectional shape of 2.1 mm × 1.3 mm and contained 3,280 Nb-46.5 wt % Ti (hereinafter referred to as NbTi) filaments 3 of 20 μm in diameter in copper matrix 2 uniformly embedded at the peripheral part of the conductor. A member comprising aluminum 4 of 99.999% in purity and a reaction-preventing Cu-10 wt % Ni layer 5 having a thickness of about 20 μm around the aluminum was placed at the central part of the conductor. The aluminum was divided into six parts at the cross section thereof with Cu-10 wt % Ni layers of about 10 μm thick. This conductor was made in the same manner as in Example 4.

The stability margin of this conductor is approximately the same at that of Example 5. The a.c. loss of the conductor of this example was 75% of that of Example 5 when used as superconducting coil for a magnetically levitated vehicle and determined at a varying magnetic field of 0.04 T and 100 Hz from coils on the ground during running at a high speed. This resulted from the decrease of eddy current loss generated in high purity aluminum. Heat generation due to the a.c. loss may be considered to be one of the disturbance energies applied to the superconducting coil. It can also be said that such low loss conductors have a relatively larger stability margin.

EXAMPLE 7

Some solenoid coils of 100 mm in inner diameter were made by winding the superconductors with a number of turns being about 1,000. The superconductors had (Cu+Al)/NbTi cross-sectional area ratios and Al/Cu cross-sectional area ratios different from each other. These coil each was made by insulation treating the surface of the conductor, winding the conductor at a tension of about 20 kg/mm$^2$, and impregnating the wound conductor with an epoxy resin. The cross-sectional structure of the conductors constituting the coils and the conditions for cooling the coils were approximately the same as the actual coils for magnetically levitated vehicles. Furthermore, in order to give thermal disturbance to these coils, the wound conductors were provided with a heater in the vicinity of a part of the maximum magnetic field, which was insulated therearound.

These coils were cooled with liquid helium to 4.2K, and the current through the coils was altered to give such disturbance energy as expected to be applied to the superconducting coil for magnetically levitated vehicle, as heat energy from the heater to the coil. In this manner it was judged whether the coil was quenched.

Figure 5:
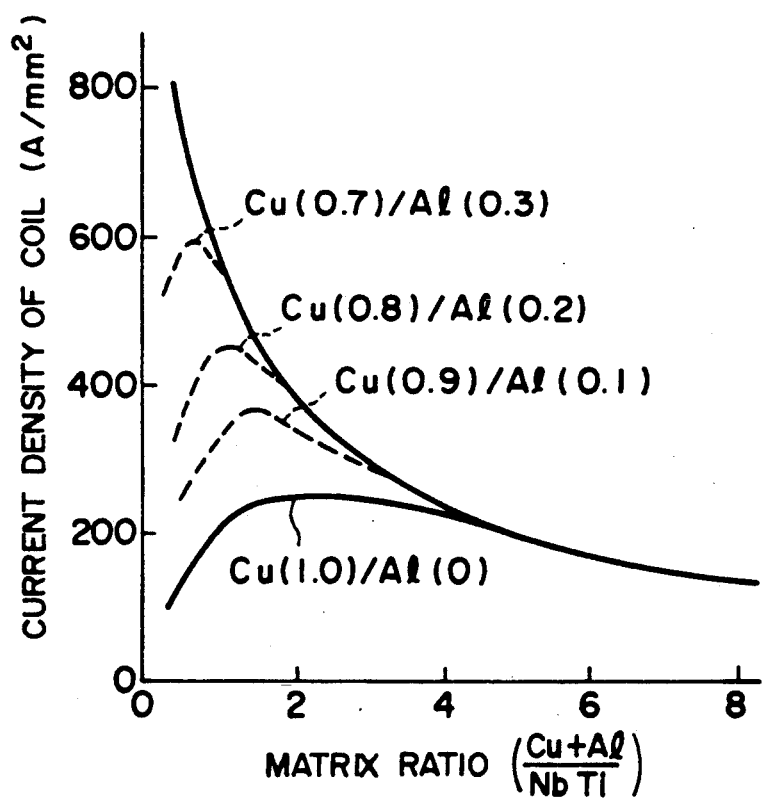
FIG. 5 shows a relationship between the matrix ratio and the current density of the coil according to the present invention, which reveals the advantages of the present invention.

FIG. 5 shows the results of the experiments above and is a graph showing the relationship between the matrix ratio, i.e., the (Cu+Al)/NbTi cross-sectional area ratio, and the current density of the coil. This graph shows a current density curve, as the critical characteristic, of each of coils having different matrix ratios, supposing that current can be passed through the coils to the critical current of each coil (under coil lead of 100%). The current density of the coil is a value obtained by dividing a boarder current at which the coil begins to be quenched at a disturbance energy with the cross-sectional area of the wound conductor. In this case, the total cross-sectional area and the critical current density of NbTi were not changed, i.e., critical current was constant, with the different matrix ratios. Furthermore, the proportion of the superconductor in the coil was constant. Therefore, it is because the current is constant and the total cross-sectional area of the superconductor is decreasing and with the matrix ratio being decreased that the critical property is increased with the matrix ratio being decreased.

The curves all represent the current density of the entirety of the coil and show the maximum at a certain matrix ratio. The current density of the entirety of the coil must correspond to the critical characteristic of the superconductor ideally, i.e., at a load of 100%. However, as the matrix ratio is decreased, the stability margin of the conductor is decreased and the coil is quenched by disturbance energy generated before the load reaches 100%. Therefore, the difference between the critical characteristic curve and the coil current density curve is an index for representing the instability of the coil. In other words, the coil current density curve approaches the critical characteristic curve as the stability is high.

A coil made of a superconductor substituting aluminum for part of copper matrix has a higher current density than that of a coil made of a conductor using copper matrix alone, when both the conductors have the same matrix ratio. The coil made of the conductor substituting aluminum for part of copper gets to have a higher current density as the amount of aluminum substituted is increasing. From FIG. 5 it is seen that the position of the maximum (peak) of the coil current density and the position at which the deviation from a load of 100% (instability) to begins to appear, transfer to the lower matrix ratio.

With a conventional aluminum-free copper matrix conductor, a coil having the same critical characteristic as that of the conductor can be obtained at a matrix ratio exceeding 5. Although a coil made of a conductor having a lower matrix ratio has a greatly increased critical characteristic, the current load of the coil is greatly decreased. As a result, it is clear that the coil current density is the highest at a matrix ratio of about 2. On the other hand, with a coil made of a composite matrix (Cu+Al) conductor, the decrease of the current load is smaller as the Al/Cu cross-sectional area ratio is increased. Thus, the position of matrix ratio at which the coil current density is the highest transfers to the side of smaller ratios.

It is found that the coil made of a wound conductor having a composite matrix (Cu+Al) according to the present invention is particularly advantageous at a lower matrix conductor and has a greatly increased coil current density over a conventional coil made of an aluminum-free matrix conductor for magnetically levitated vehicles.

The coils according to the present invention are used for magnetically levitated vehicles, nuclear magnetic resonance apparatuses, magnetically levitated rocket propelling apparatuses, electromagnetically propelling ships and the like.

Figure 6A:
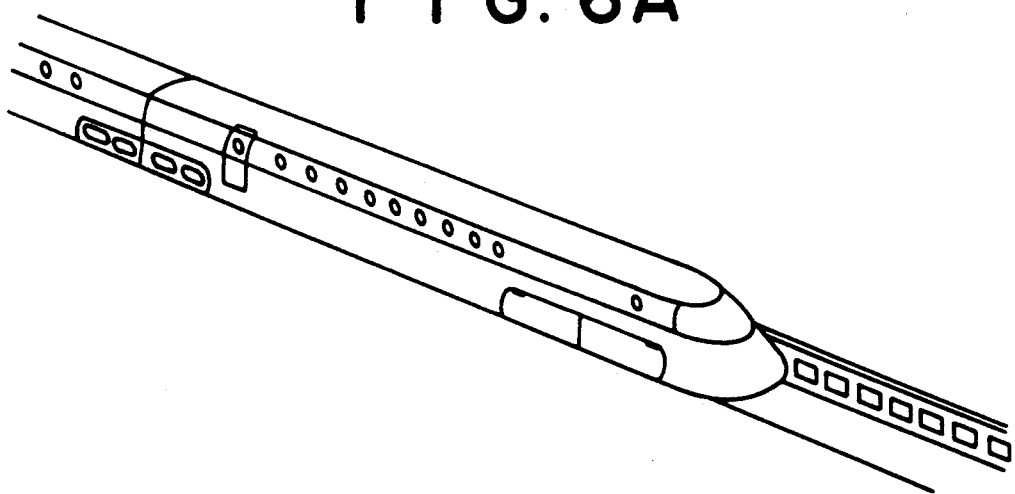
FIG. 6(a), FIG. 6(b) and FIG. 6(c) show a sketch illustrating one example of the superconducting coils according to the present invention which is used in magnetically levitated vehicles.
Figure 6B:
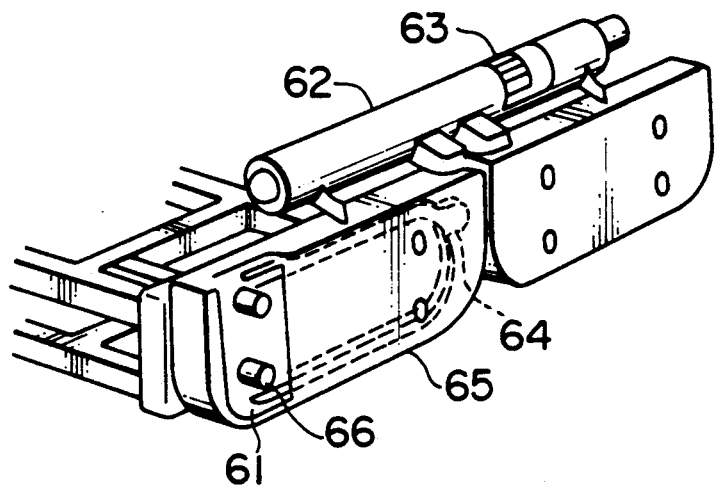
Figure 6C:
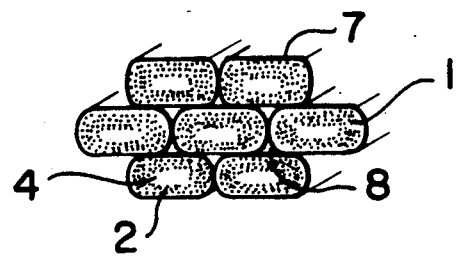

One example of the coils according to the present invention for use in magnetically levitated vehicles is diagrammatically shown in FIG. 6(a), FIG. 6(b) and FIG. 6(c). FIG. 6(a) is a pictorial view of illustrating a magnetically levitated vehicle in which the position of a superconducting magnet using the superconductor of the present invention is shown. FIG. 6(b) is an enlarged view of the magnet. In FIG. 6(b), reference numbers 61, 62, 63, 64, 65 and 66 denote a superconducting coil, liquid helium tank, heat exchanger for condensation, permanent current switch, superconducting magnet vessel and load supporter. FIG. 6(c) is an enlarged diagram-matical cross-sectional view of part of the superconducting coil. In FIG. 6(c), reference numbers 1, 2, 4, 7 and 8 denote a superconducting filament of NbTi, stabilizing material of copper (matrix), stabilizing material of aluminum (matrix), insulating material of a formal and binder of an epoxy resin.

Figure 7:
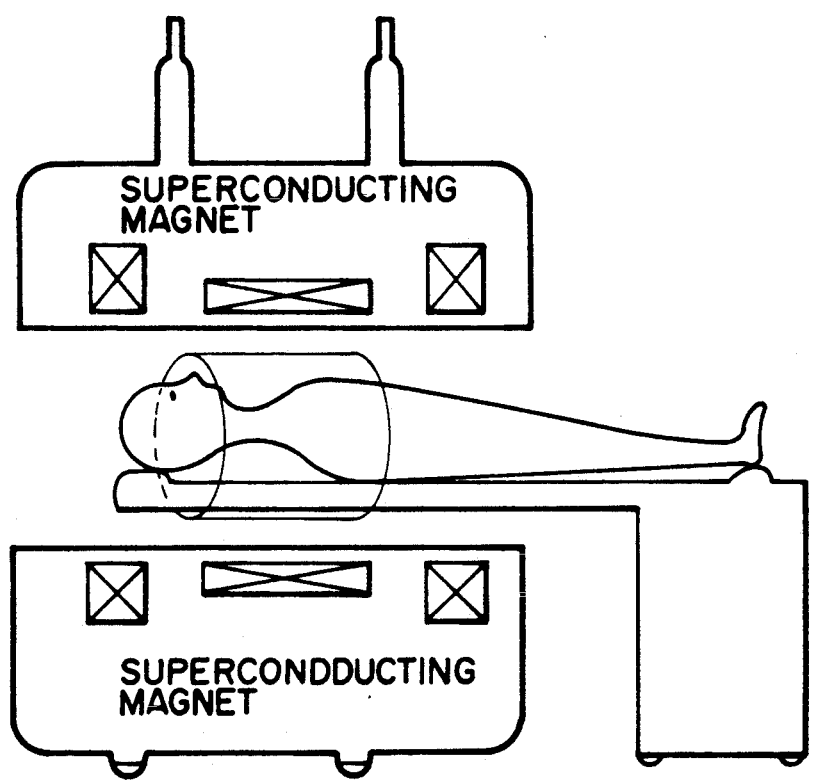
FIG. 7 is a diagrammatical view of a nuclear magnetic resonance apparatus using one of example of the superconducting coils according to the present invention.

Another example of the coils according to the present invention for use in nuclear magnetic resonance diagnosis apparatuses is shown in FIG. 7.

According to the present invention, the coil current density can be increased at a low matrix ratio of the superconductor. Therefore, the coil for magnetically levitated vehicles can be rendered smaller in size and lighter in weight, which leads to the increase of floating force. This means that the high-speed levitation running of the vehicles is made possible with a superconducting coil having a smaller magnetomotive force. Costs for making the coils can be reduced and the number of passengers carried per car can be increased. Thus, great economical advantages can be obtained by the present invention.

According to the present invention, the stability margin of the superconducting coil can be greatly increased. Therefore, the coil mounted on the vehicle is not quenched even when the vehicle is running at a high speed. Thus, the coil of the present invention is highly reliable.

The advantages of the coil according to the present invention with magnetically levitated vehicles are similar with nuclear magnetic resonance diagnosis apparatus (MRI). That is, since the coil can be made smaller, the apparatus using the coil can be installed on a medical car as well as in a small room in a hospital.

What is claimed is:

1. A superconductor wire, having a cross section, which has an aluminum area at the center of the cross section, and a copper composite conductor area, having a copper matrix and multifilamentary NbTi embedded in the copper matrix, at the peripheral part of the cross section, around the aluminum area, wherein the cross-sectional area ratio of (Cu+Al)/NbTi is in the range of 0.5 to 3.0 and the cross-sectional area ratio of Al/Cu is in the range of 0.05 to 0.5.

2. A superconducting coil which comprises a superconductor, the superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, the superconductor being wound in a coil form, wherein the cross-sectional area ratio of (Cu+Al)/NbTi is in the range of 0.5 to 3.0 and the cross-sectional area ratio of Al/Cu is in the range of 0.05 to 0.5.

3. A superconducting coil which comprises a superconductor, the superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, the superconductor being wound in a coil form, wherein the cross-sectional area ratio of (Cu+Al)/NbTi is in the range of 0.5 to 3.0 and the cross-sectional arae ratio of Al/Cu is in the range of 0.05 to 0.5, and said coil has a binder between the superconductor and an adjacent superconductor.

4. A superconducting coil for use in a magnetically levitated vehicle, which comprises a superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, the superconductor being wound in a coil form, wherein the cross-sectional area ratio of (Cu+Al)/NbTi is in the range of 0.8 to 1.5 and the cross-sectional area ratio of Al/Cu is in the range of 0.1 to 0.4, and said coil has a binder between the superconductor and an adjacent superconductor.

5. A superconducting coil for use in a nuclear magnetic resonance apparatus, which comprises a superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, the superconductor being wound in a coil form, wherein the cross-sectional area ratio of (Cu+Al)/NbTi is in the range of 1.0 to 2.8 and the cross-sectional area ratio of Al/Cu is in the range of 0.1 to 0.4.

6. A superconductor, having a cross section, which has (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, wherein the cross-sectional area ratio of (Cu+Al)/NbTi is in the range of 0.5 to 3.0 and the cross-sectional area ratio of Al/Cu is in the range of 0.05 to 0.5.

7. A superconducting coil which comprises a superconductor having a cross section and having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, wherein the cross-sectional area ratio of (Cu+Al)/NbTi is in the range of 0.5 to 3.0 and the cross-sectional area ratio of Al/Cu is in the range of 0.05 to 0.5, the superconductor being wound in a coil form.

8. A superconducting coil, having a cross section, which comprises a superconductor having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, wherein the cross-sectional area ratio of (Cu+Al)/NbTi is in the range of 0.5 to 3.0 and the cross-sectional area ratio of Al/Cu is in the range of 0.05 to 0.5, the superconductor being wound in a coil form and wherein said coil has a binder between the superconductor and an adjacent superconductor.

9. A superconducting coil for use in a magnetically levitated vehicle, which comprises a superconductor having a cross section and having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, the superconductor being wound in a coil form, wherein the cross-sectional area ratio of (Cu+Al)/NbTi is in the range of 0.8 to 1.5 and the cross-sectional area ratio of Al/Cu is in the range of 0.1 to 0.4, and said coil has a binder between the superconductor and an adjacent superconductor.

10. A superconducting coil for use in a nuclear magnetic resonance apparatus, which comprises a superconductor having a cross section and having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, the superconductor being wound in a coil form, wherein the cross-sectional area ratio of (Cu+Al)/NbTi is in the range of 1.0 to 2.8 and the cross-sectional area ratio of Al/Cu is in the range of 0.1 to 0.4.

11. A superconductor, having a cross section, which has an aluminum area at the center of the cross section, and a copper composite conductor area, having a copper matrix and multifilamentary NbTi embedded in the copper matrix, at the peripheral part of the cross section, around the aluminum area, said aluminum area being divided into a plurality of parts by separators made of a metal having a higher resistivity than that of copper and aluminum, wherein the cross-sectional area ratio of (Cu+Al)/NbTi is in the range of 0.5 to 3.0 and the cross-sectional area ratio of Al/Cu is in the range of 0.05 to 0.5.

12. A superconducting coil which comprises a superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, said aluminum area being divided into a plurality of parts by separators made of a metal having a higher resistivity than that of copper and aluminum, the superconductor being wound in a coil form, wherein the cross-sectional area ratio of (Cu+Al)/NbTi is in the range of 0.5 to 3.0 and the cross-sectional area ratio of Al/Cu is in the range of 0.05 to 0.5.

13. A superconducting coil which comprises a superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, said aluminum area being divided into a plurality of parts by separators made of a metal having a higher resistivity than that of copper and aluminum, the superconductor being wound in a coil form, wherein the cross-sectional area ratio of (Cu+Al)/NTi is in the range of 0.5 to 3.0 and the cross-sectional area ratio of Al/Cu is in the range of 0.05 to 0.5, and said coil has a binder between the superconductor and an adjacent superconductor.

14. A superconducting coil for use in a magnetically levitated vehicle, which comprises a superconductor having a cross section and having (1) an aluminum area at the center of the cross section, and (2) a copper composite conductor area, having a copper matrix and multifilamentary NbTi embedded in the copper matrix, at the peripheral part of the cross section, around the aluminum area, said aluminum area being divided into a plurality of parts by separators made of a metal having a higher resistivity than that of copper and aluminum, the superconductor being wound in a coil form, wherein the cross-sectional area ratio of (Cu+Al)/NbTi is in the range of 0.8 to 1.5 and the cross-sectional area ratio of Al/Cu is in the range of 0.1 to 0.4, and said coil has a binder between the superconductor and an adjacent superconductor.

15. A superconducting coil for use in a nuclear magnetic resonance apparatus, which comprises a superconductor having a cross section and (1) having an aluminum area at the center of the cross section, and (2) a copper composite conductor area, having a copper matrix and multifilamentary NbTi embedded in the copper matrix, at the peripheral part of the cross section, around the aluminum area, said aluminum area being divided into a plurality of parts by separators made of a metal having a higher resistivity than that of copper and aluminum, the superconductor being wound in a coil form, wherein the cross-sectional area ratio of (Cu+Al)/NbTi is in the range of 1.0 to 2.8 and the cross-sectional area ratio of Al/Cu is in the range of 0.1 to 0.4.

16. A superconductor, having a cross section, which has (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, said aluminum area being divided into a plurality of parts by separators made of a metal having a higher resistivity than that of copper and aluminum, wherein the cross-sectional area ratio of (Cu+Al)/NbTi is in the range of 0.5 to 3.0 and the cross-sectional area ratio of Al/Cu is in the range of 0.05 to 0.5.

17. A superconducting coil which comprises a superconductor having a cross section and having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, the superconductor being wound in a coil form, said aluminum area being divided into a plurality of parts by separators made of a metal having a higher resistivity than that of copper and aluminum, wherein the cross-sectional area ratio of (Cu+Al)/NbTi is in the range of 0.5 to 3.0 and the cross-sectional area ratio of Al/Cu is in the range of 0.05 to 0.5.

18. A superconducting coil which comprises a superconductor having a cross section and having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, said aluminum area being divided into a plurality of parts by separators made of a metal having a higher resistivity than that of copper and aluminum, wherein the cross-sectional area ratio of (Cu+Al)/NbTi is in the range of 0.5 to 3.0 and the cross-sectional area ratio of Al/Cu is in the range of 0.05 to 0.5, the superconductor being wound in a coil form, and wherein said coil has a binder between the superconductor and an adjacent superconductor.

19. A superconducting coil for use in a magnetically levitated vehicle, which comprises a superconductor having a cross section and having (1) an aluminum area at the center of the cross section, a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, the superconductor being wound in a coil form, said aluminum area being divided into a plurality of parts by separators made of a metal having a higher resistivity than that of copper and aluminum, wherein the cross-sectional area ratio of (Cu+Al)/NbTi is in the range of 0.8 to 1.5 and the cross-sectional area ratio of Al/Cu is in the range of 0.1 to 0.4, and said coil has a binder between the superconductor and an adjacent superconductor.

20. A superconducting coil for use in a nuclear magnetic resonance apparatus, which comprises a superconductor having a cross section and having (1) an aluminum area at the center of the cross section, (2) a copper composite conductor area, having a copper matrix and multifilamentary NbTi embedded in the copper matrix, at the peripheral part of the cross section, around the aluminum area, and (3) a reaction-preventing layer at the interface between the aluminum area and the copper composite conductor area, the superconductor being wound in a coil form, said aluminum area being divided into a plurality of parts by separators made of a metal having a higher resistivity than that of copper and aluminum, wherein the cross-sectional area ratio of (Cu+Al)/NbTi is in the range of 1.0 to 2.8 and the cross-sectional area ratio of Al/Cu is in the range of 0.1 to 0.4.

21. A superconductor wire according to claim 1, wherein the aluminum of the aluminum area has a residual resistance ratio ($R_{293K}/R_{4.2K}$) of at least 200.

22. A superconductor wire according to claim 1, wherein the cross-sectional ratio of (Cu+Al)/NbTi is 0.8 to 2.8, and the cross-sectional ratio of Al/Cu is 0.1 to 0.4.

23. A superconducting coil according to claim 3, wherein the binder is selected from the group consisting of epoxy resin, phenol resin, unsaturated polyester resin, urethane resin, melamine resin, urea resin, addition reaction polyester resin and silicone resin.

24. A superconductor coil according to claim 23, wherein the binder is an epoxy resin.

25. A superconductor according to claim 6, wherein the reaction-preventing layer is made of a material selected from the group consisting of Nb, Ni, Ti, Zr, V, Ta and CuNi.

26. A superconductor according to claim 11, wherein the metal having a higher resistivity than that of copper and aluminum is CuNi.

27. A superconducting coil according to claim 3, wherein the coil includes a plurality of the superconductors positioned adjacent to each other and having interstices therebetween, the interstices being filled with said binder.

28. A superconducting coil according to claim 8, wherein the coil includes a plurality of the superconductors positioned adjacent to each other and having interstices therebetween, the interstices being filled with said binder.

29. A superconducting coil according to claim 13, wherein the coil includes a plurality of the superconductors positioned adjacent to each other and having interstices therebetween, the interstices being filled with said binder.

30. A superconducting coil according to claim 18, wherein the coil includes a plurality of the superconductors positioned adjacent to each other and having interstices therebetween, the interstices being filled with said binder.

31. A method of manufacturing an aluminum-stabilized superconductor, which comprises the first step of providing a superconductor-copper composite hollow body in which copper films are applied around the superconducting materials, the second step of area reducing said composite hollow body, the third step of heat treatment of said body, the fourth step of inserting an aluminum body into the hollow of said hollow body, the fifth step of subjecting the body to working such as drawing, the sixth step of subjecting the body to working such as twisting, forming or the like, an additional area reduction being carried out, if necessary, subsequent to the third step.

32. A method of manufacturing a superconductor with having (1) an aluminum area at the center in the cross-section of said superconductor and (2) a copper composite conductor area, having a copper matrix and multifilamentary NbTi embedded in the copper matrix, at the peripheral part of the cross section, which comprises the first step of providing a superconductor-copper composite hollow body comprising a copper film-covered superconducting material, the second step of area reducing said hollow body, the third step of heat treating said body, the fourth step of inserting an aluminum body into the hollow of said hollow body, the fifth step of subjecting said body to working such as drawing, the sixth step of subjecting said body to working such as twisting, forming or the like, an additional area reduction being carried out, if necessary, subsequent to the third step, wherein the cross-sectional area ratio of (CU+Al)/NbTi is in the range of 0.5 to 3.0 and the cross-sectional area ratio of Al/Cu is in the range of 0.05 to 0.5.

* * * * *